US009083244B2

(12) United States Patent
Sugahara

(10) Patent No.: US 9,083,244 B2
(45) Date of Patent: Jul. 14, 2015

(54) POWER CONVERSION APPARATUS

(75) Inventor: Tetsuo Sugahara, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 216 days.

(21) Appl. No.: 13/990,291

(22) PCT Filed: Dec. 2, 2010

(86) PCT No.: PCT/JP2010/071607
§ 371 (c)(1),
(2), (4) Date: May 29, 2013

(87) PCT Pub. No.: WO2012/073372
PCT Pub. Date: Jun. 7, 2012

(65) Prior Publication Data
US 2013/0249460 A1    Sep. 26, 2013

(51) Int. Cl.
*H05K 7/20* (2006.01)
*H02M 1/32* (2007.01)
(Continued)

(52) U.S. Cl.
CPC ............... *H02M 1/32* (2013.01); *H02M 7/797* (2013.01); *H02P 6/001* (2013.01); *H02P 27/06* (2013.01); *H05K 7/20936* (2013.01); *H05K 7/20945* (2013.01)

(58) Field of Classification Search
USPC .............. 363/40, 41, 55, 56.01, 56.02, 56.03, 363/56.05, 56.07, 56.08, 95, 98, 131, 132, 363/141
See application file for complete search history.

(56) References Cited

U.S. PATENT DOCUMENTS 6,724,313 B2 *  4/2004  Sato et al. ...................... 340/590
8,354,813 B2    1/2013  Hasegawa et al.
(Continued)

FOREIGN PATENT DOCUMENTS

| JP | 11-004505 A  | 6/1999 |
| JP | 2008-253098 A | 10/2008 |
| JP | 2009-095232 A | 4/2009 |
| JP | 2009-148079 A | 7/2009 |

OTHER PUBLICATIONS

International Search Report (PCT/ISA/210) issued on Feb. 8, 2011, by the Japanese Patent Office as the International Searching Authority for International Application No. PCT/JP2010/071607.
(Continued)

*Primary Examiner* — Nguyen Tran
(74) *Attorney, Agent, or Firm* — Buchanan Ingersoll & & Rooney PC

(57) ABSTRACT

In a power conversion apparatus that is configured to cool switching elements by using a boiling-refrigerant-type cooling device that uses a boiling phenomenon of a refrigerant included therein, an inverter control unit that controls the switching elements (Su to Sz) by generating a gate command capable of stabilizing boiling of the refrigerant includes a modulation-mode selection unit that determines stability of the cooling device based on an element-temperature estimation value that is an estimated temperature of the switching elements (Su to Sz), and that decides and selects a modulation mode PM for controlling the switching elements (Su to Sz) based on a determination result, and a gate-command generation unit that generates a gate command G based on the modulation mode PM selected by the modulation-mode selection unit.

15 Claims, 16 Drawing Sheets

(51) Int. Cl.
*H02M 7/797* (2006.01)
*H02P 27/06* (2006.01)
*H02P 6/00* (2006.01)

(56) References Cited

U.S. PATENT DOCUMENTS

2007/0273312 A1* 11/2007 Sakurai et al. ............... 318/254
2014/0092655 A1* 4/2014 Igarashi et al. ............ 363/56.03

OTHER PUBLICATIONS

Written Opinion (PCT/ISA/237) issued on Feb. 8, 2011, by the Japanese Patent Office as the International Searching Authority for International Application No. PCT/JP2010/071607.

"Heat Transfer", The Japan Society of Mechanical Engineers, Maruzen Publishing, Mar. 2005, pp. 128~130.

* cited by examiner (a)   (b)

POWER CONVERSION APPARATUS

FIELD

The present invention relates to a power conversion apparatus for controlling a motor to be driven, for example.

BACKGROUND

A power conversion apparatus performs power conversion by allowing switching elements such as a MOSFET or an IGBT to perform a switching operation. At this time, a switching loss occurs to follow the switching operation performed by the switching elements. When the switching loss occurs, the temperature of the switching elements (hereinafter, "element temperature") rises. Therefore, a cooling device is indispensable to suppressing the element temperature from rising.

The cooling device is generally configured to include fins for cooling the heat generated by the elements. There are many cooling devices based on boiling-refrigerant-type cooling that uses the boiling phenomenon of a refrigerant included therein so as to further enhance cooling capability.

In the cooling device based on the boiling-refrigerant-type cooling (hereinafter, "boiling-refrigerant-type cooling device"), the refrigerant is filled in the fins and boiled by the heat generated by the elements and the evaporated refrigerant is cooled by the cooling air via a condenser, thereby cooling the elements. In this way, the boiling-refrigerant-type cooling device is a cooling device having high cooling capability because of the use of the refrigerant.

Despite the high cooling capability, the boiling-refrigerant-type cooling is known to have properties that boiling is not stable and the operation is unstable in a region in which the heat generated by the elements is low (see, for example, Non Patent Literature 1).

CITATION LIST

Non Patent Literature

Non Patent Literature 1: "Heat Transfer", The Japan Society of Mechanical Engineers, Maruzen Publishing, March 2005, P. 128~130

SUMMARY

Technical Problem

As described above, the boiling-refrigerant-type cooling has the properties that the boiling phenomenon is not stable and the operation is unstable in an unstable boiling region. Therefore, the conventional boiling-refrigerant-type cooling device has a problem that the element temperature excessively rises if the elements continue to operate in the unstable boiling region.

Furthermore, conventional power conversion apparatuses that use the boiling-refrigerant-type cooling lie in the concept of changing a switching frequency for controlling the constituent elements of the power conversion apparatus in proportion to a refrigerant capability. However, the concept of any of the conventional power conversion apparatuses is limited to the concept or technical idea of controlling the switching frequency without surpassing the cooling capability of the refrigerant. There have been no literatures referring to the unstable boiling region to the extent that the present applicant has conducted researches.

The present invention has been achieved in view of the above problems, and an object of the present invention is to provide a power conversion apparatus that positively controls a boiling-refrigerant-type cooling device so as not to cause an operating point of the boiling-refrigerant-type cooling device to transition to an unstable boiling region.

Solution to Problem

In order to solve the above problem and in order to attain the above object, in a power conversion apparatus that is configured to convert input direct current power or alternating current power into desired alternating current power by a switching operation performed by a switching element, to output the desired alternating current power, and to cool the switching element by using a boiling-refrigerant-type cooling device that uses a boiling phenomenon of a refrigerant included therein, the power conversion apparatus of the present invention includes a control unit that controls the switching element by generating a gate command capable of stabilizing boiling of the refrigerant. Additionally, the control unit includes a modulation-mode selection unit that determines stability of the cooling device based on an element-temperature estimation value that is an estimated temperature of the switching element, and that decides and selects a modulation mode for controlling the switching element based on a determination result, and a gate-command generation unit that generates the gate command based on the modulation mode selected by the modulation-mode selection unit.

Advantageous Effects of Invention

According to the present invention, it is possible to provide a power conversion apparatus that can ensure deterring an operating point of a boiling-refrigerant-type cooling device from entering an unstable boiling region.

DESCRIPTION OF EMBODIMENTS

Exemplary embodiments of a power conversion apparatus according to the present invention will be explained below in detail with reference to the accompanying drawings. The present invention is not limited to the embodiments.

First Embodiment

Figure 1:
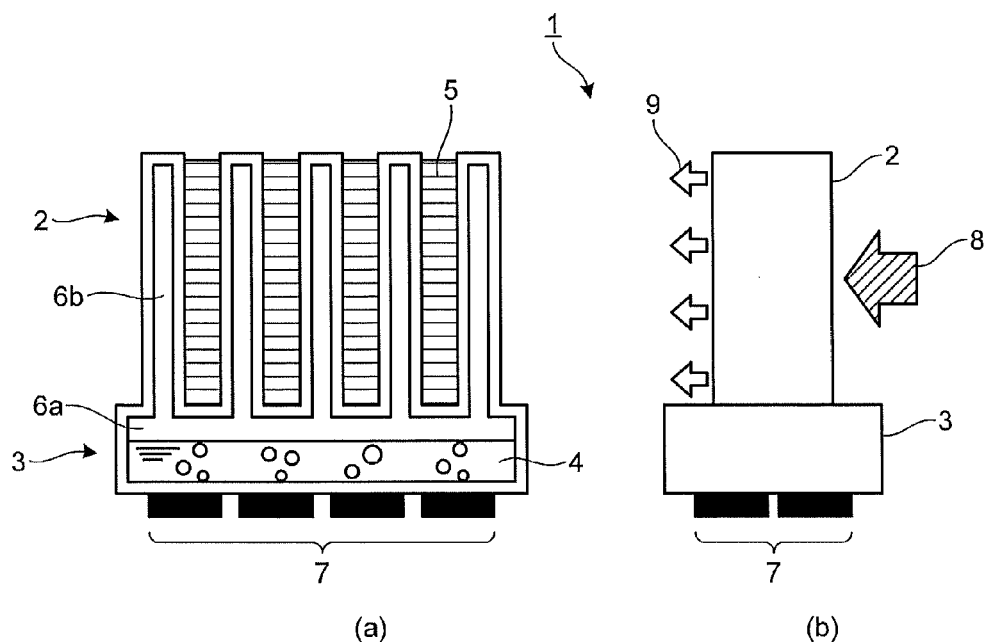
FIG. 1 are schematic diagrams of a configuration example of a cooling device suitable to be used in a power conversion apparatus according to a first embodiment of the present invention.

FIG. 1 are schematic diagrams of a configuration example of a cooling device suitable to be used in a power conversion apparatus according to a first embodiment of the present invention, where FIG. 1(a) is a front view and FIG. 1(b) is a side view. A cooling device 1 shown in FIG. 1 is a boiling-refrigerant-type cooling device and configured to include a condenser 2 serving as a radiation unit, an evaporator 3 serving as a heat absorbing unit, a refrigerant 4, fins 5, and the like. A switching element 7 that is provided in the power conversion apparatus (described later) and constitutes a main circuit is attached to and in contact with the evaporator 3 (FIG. 1 are a configuration example in which the switching element 7 is attached to a lower portion of the evaporator 3). Furthermore, the refrigerant 4 is sealed into a refrigerant chamber 6a provided within the evaporator 3.

When the switching element 7 generates heat, the temperature of the refrigerant 4 rises. When the temperature of the refrigerant 4 reaches a certain temperature, the refrigerant 4 boils and the evaporated refrigerant 4 enters a refrigerant chamber 6b provided within the condenser 2. Some cooling devices are configured so that the evaporated refrigerant also enters fins, depending on configurations of the cooling devices. The fins 5 radiate the heat generated by the switching element 7. As shown in FIG. 1, when cooling air 8 is fanned toward the fins 5, it is possible to accelerate hot air 9 passing through the condenser 2 to move and to realize the cooling device having high cooling efficiency.

Figure 2:
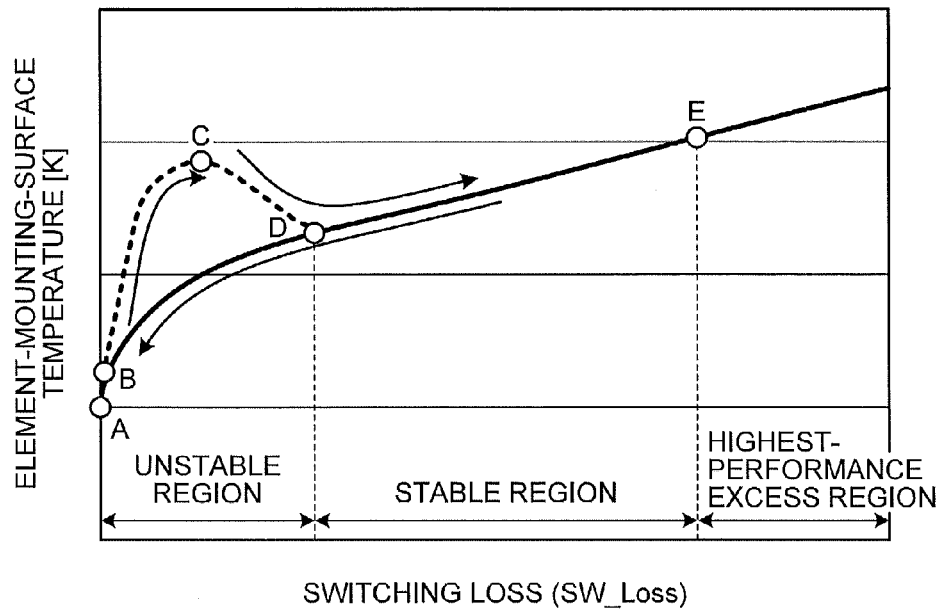
FIG. 2 is an example of switching loss-to-element temperature characteristics of a boiling-refrigerant-type cooling device.

FIG. 2 is an example of switching loss-to-element temperature characteristics of the boiling-refrigerant-type cooling device. In FIG. 2, a horizontal axis represents a switching loss and a vertical axis represents an element-mounting-surface temperature. First, when the switching loss is in a region equal to or lower than a point C, the boiling of the refrigerant is not accelerated. Accordingly, a thermal resistance of the cooling device increases and an element temperature rises. On the other hand, when the switching loss equal to or higher than the point C is input to the cooling device, the boiling is accelerated. Accordingly, the thermal resistance of the cooling device decreases and the element temperature falls.

When the switching loss is equal to or higher than a point D, the boiling is stable and continued even when the switching loss decreases to be equal to or lower than the point D. However, when the switching loss is equal to or lower than a point B, the boiling stops. Unless a switching loss equal to or higher than the point C is input to the cooling device in this state, the boiling is not accelerated. That is, in a region from a point A to the point D shown in FIG. 2, there is a probability that a boiling phenomenon is not is stable, the switching element has an excessive temperature rise, and that the switching element exceeds its usage limit and then breaks.

There is also a concept of a highest-performance excess region (which is a region at the right of a point E in the example of FIG. 2) as well as the unstable boiling region as characteristics of the cooling device. To use the element in the highest-performance excess region means to continue to use the element in a state of a high element-mounting-surface temperature. Therefore, if the element continues to be used in the highest-performance excess region, there is a probability that the element has an excessive temperature rise, exceeds the usage limit, and then breaks.

Although no mention has been made as for an ambient temperature of the cooling device in the above explanations, it is needless to mention that the stability of the boiling phenomenon depends not only on the switching loss but also on the ambient temperature.

Figure 3:
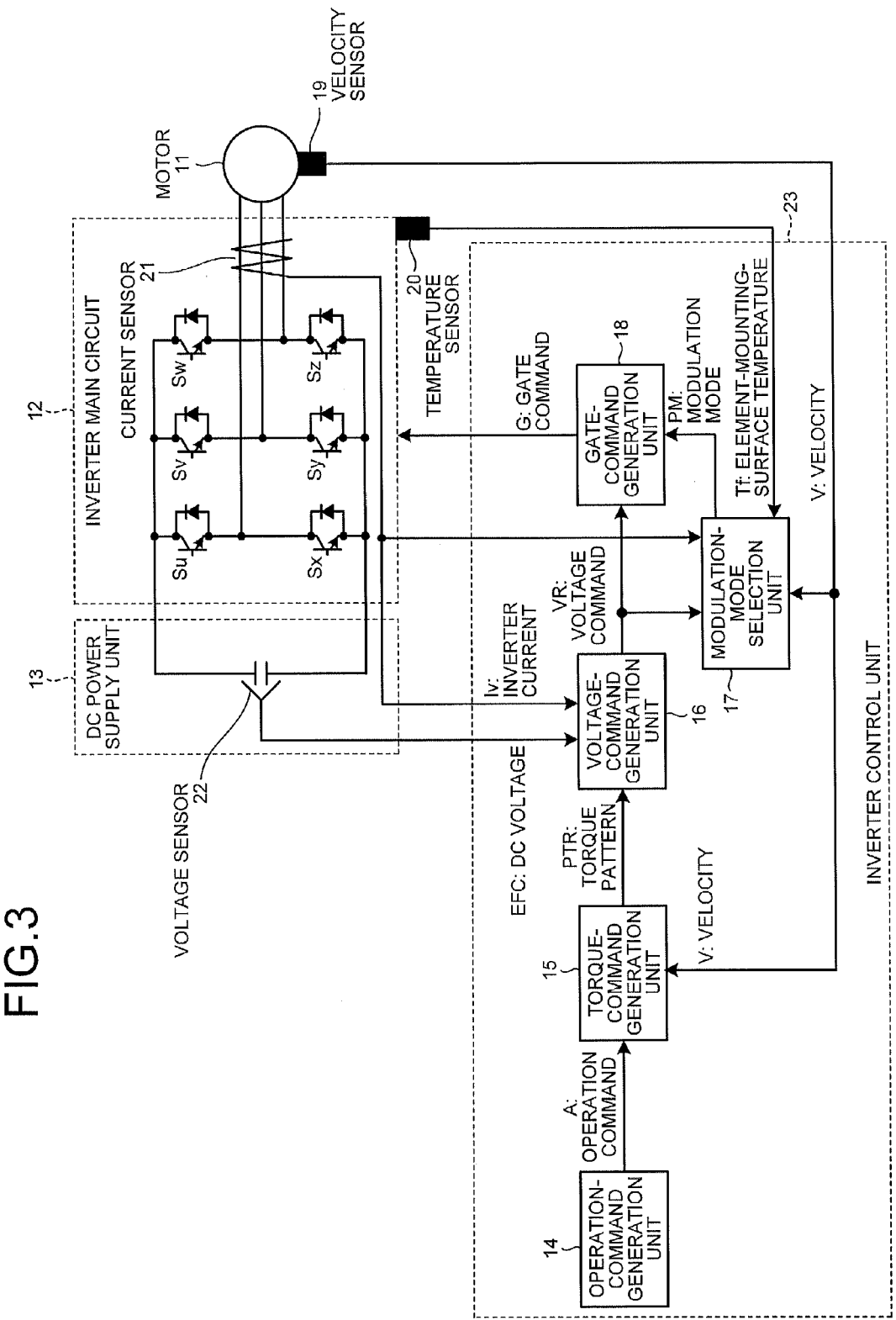
FIG. 3 is a block diagram of functions of the power conversion apparatus according to the first embodiment of the present invention.

FIG. 3 is a block diagram of functions of the power conversion apparatus according to the first embodiment of the present invention. Principal elements of the power conversion apparatus are an inverter main circuit 12, a direct current (DC) power supply unit 13, and an inverter control unit 23. Furthermore, a motor 11 operating at a three-phase alternating current (AC) (such as an induction motor or a synchronous motor) is connected to an output of the inverter main circuit 12. A velocity sensor 19 that measures the number of revolutions of the motor 11 is provided at the motor 11, and a temperature sensor 20 that measures a temperature of a mounting surface on which switching element is mounted either directly or indirectly is provided at the inverter main circuit 12.

The inverter main circuit 12 includes circuit units (legs) in which positive-side arms (such as a switching element Su for phase U) constituted by switching elements Su, Sv, and Sw and negative-side arms (such as a switching element Sx for the phase U) constituted by switching elements Sx, Sy, and Sz are connected in series, respectively. That is, a three-phase bridge circuit including three sets (for phases U, V, and W) of legs is constituted in the inverter main circuit 12. Furthermore, a current sensor 21 is provided among lines that connect AC terminals (median points of the respective legs) of the inverter main circuit 12 to the motor 11.

The DC power supply unit 13 is a constituent element having a DC power accumulation capability, and a battery, a capacitor, and the like is assumed as the DC power supply unit 13. A voltage sensor 22 for detecting a DC voltage is provided in the DC power supply unit 13.

The inverter control unit 23 includes an operation-command generation unit 14, a torque-command generation unit 15, a voltage-command generation unit 16, a modulation-mode selection unit 17, and a gate-command generation unit 18. The gate-command generation unit 18 located at a last stage of the inverter control unit 23 outputs a gate command G. The switching elements (Su to Sz) of the inverter main circuit 12 are controlled to be turned on or off in response to the gate command G. DC power supplied from the DC power supply unit 13 is converted into three-phase AC power at a variable amplitude and a variable frequency, and the resultant three-phase AC power is supplied to the motor 11.

Figure 4:
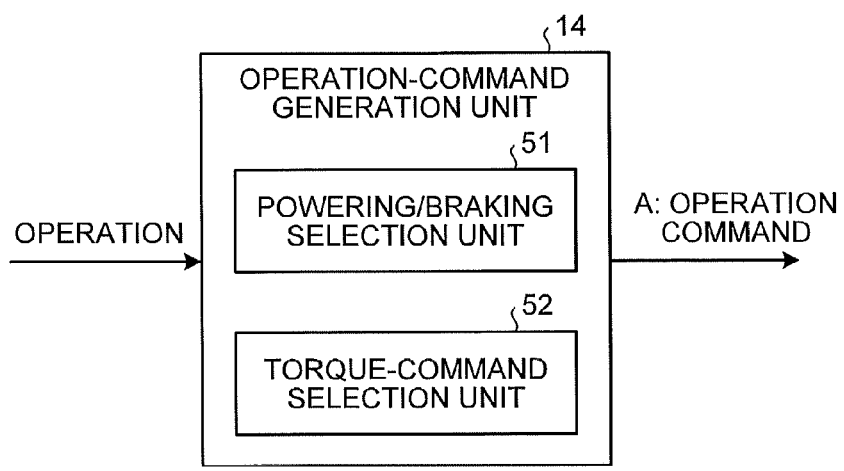
FIG. 4 depicts a detailed configuration of an operation-command generation unit.
Figure 7:
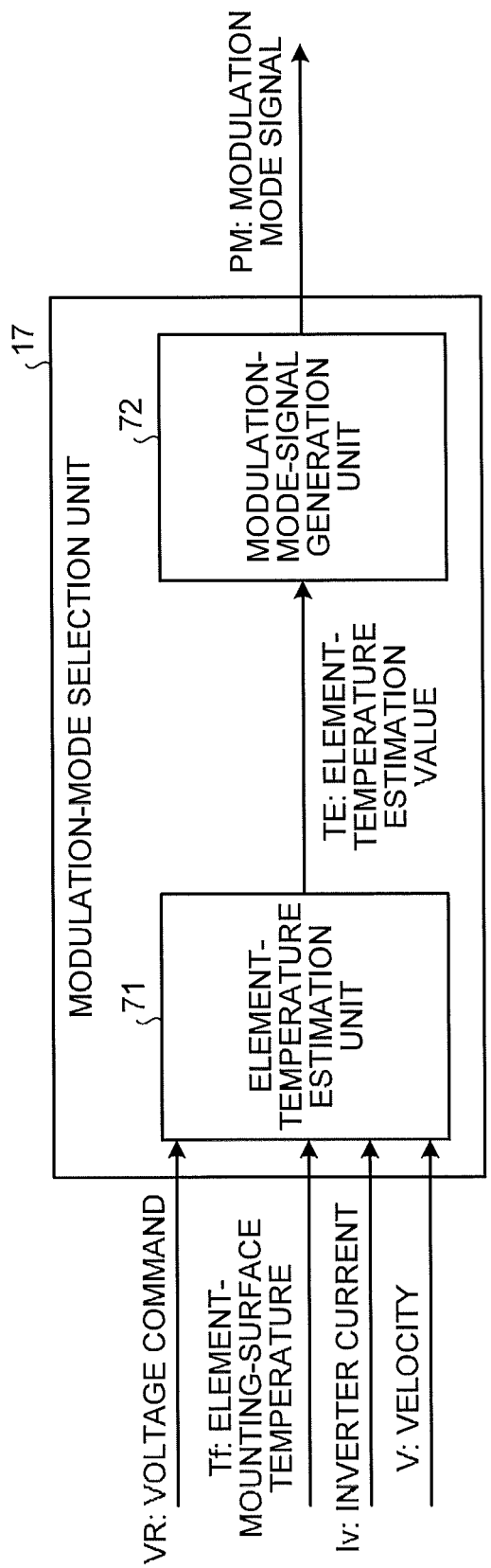
FIG. 7 depicts a detailed configuration of a modulation-mode selection unit.
Figure 8:
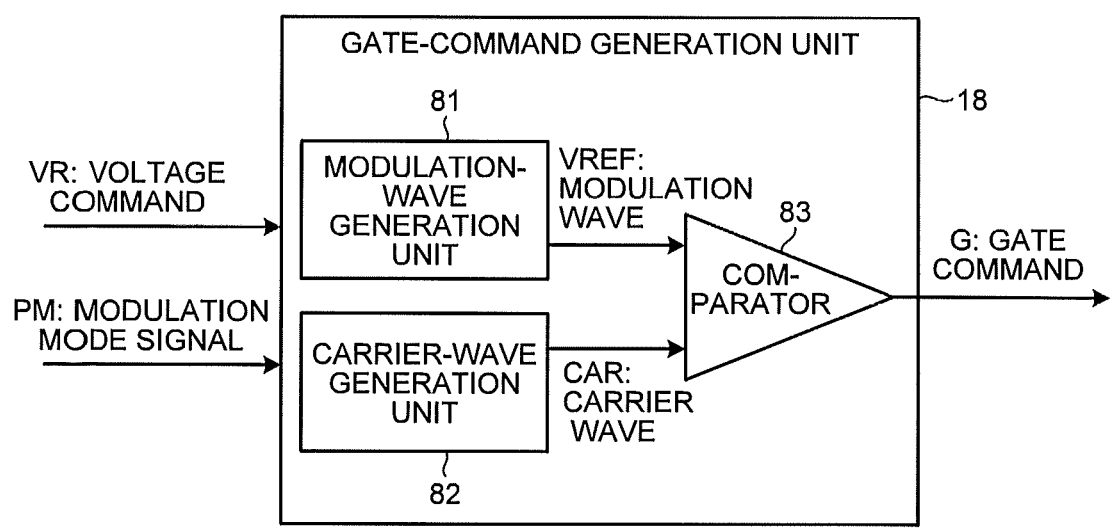
FIG. 8 depicts a detailed configuration of a gate-command generation unit.

Configurations and operations of the constituent elements that constitute the inverter control unit 23 are explained next with reference to FIGS. 4 to 8. FIG. 4 depicts a detailed configuration of the operation-command generation unit 14, FIG. 5 depicts a detailed configuration of the torque-command generation unit 15, FIG. 6 depicts a detailed configuration of the voltage-command generation unit 16, FIG. 7 depicts a detailed configuration of the modulation-mode selection unit 17, and FIG. 8 depicts a detailed configuration of the gate-command generation unit 18.

First, as shown in FIG. 4, the operation-command generation unit 14 includes a powering/braking selection unit 51 and a torque-command selection unit 52. The powering/braking selection unit 51 determines whether an operator's operation (a notch operation) is a powering command or a braking command. The torque-command generation unit 52 determines whether a torque command in response to the powering command or the braking command is a powering torque command or a regenerative torque command. Processes performed by the powering/braking selection unit 51 are output to the torque-command generation unit 15 at the next stage as an operation command A including the powering or braking command. In a case where an operation-command output unit is provided on a cab as seen in a railway vehicle, for example, it is unnecessary to add functions of the operation-command generation unit 14 of this type to the inverter control unit 23.

Figure 5:
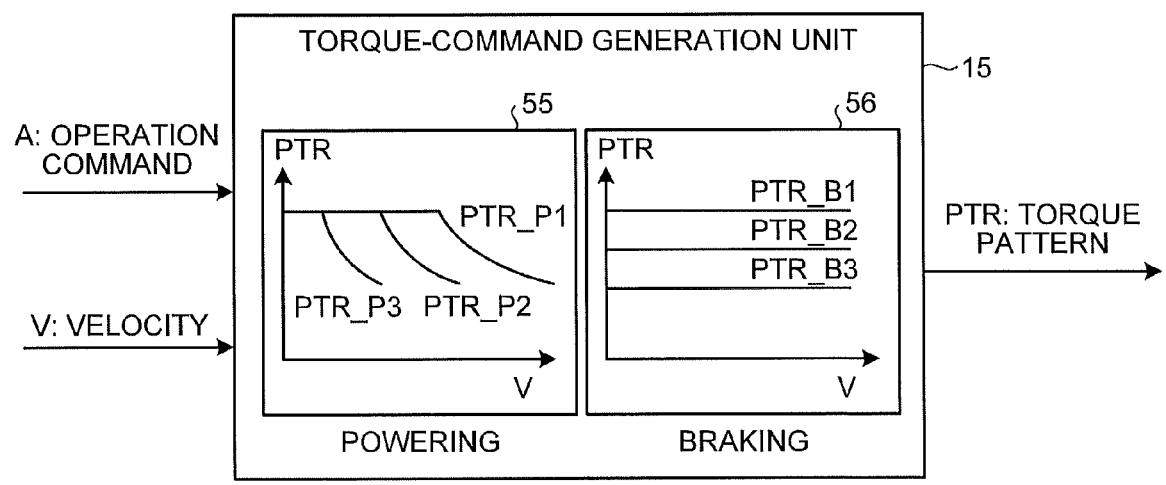
FIG. 5 depicts a detailed configuration of a torque-command generation unit.

As shown in FIG. 5, the torque-command generation unit 15 includes a powering-torque-command generation unit 55 and a braking-torque-command generation unit 56. The torque-command generation unit 15 calculates the necessary torque necessary that is to be output by the motor 11 based on the operation command A and a velocity signal V from the velocity sensor 19, and outputs necessary torque patterns PTR to the voltage-command generation unit 16. While FIG. 5 depicts the torque patterns PTR generated by the powering-torque-command generation unit 55 and the braking-torque-command generation unit 56 in a form of a graph, these torque patterns PTR can be obtained by a functional calculus or held in a processing unit in a form of a table. Furthermore, these torque patterns PTR can be replaced by current patterns.

Figure 6:
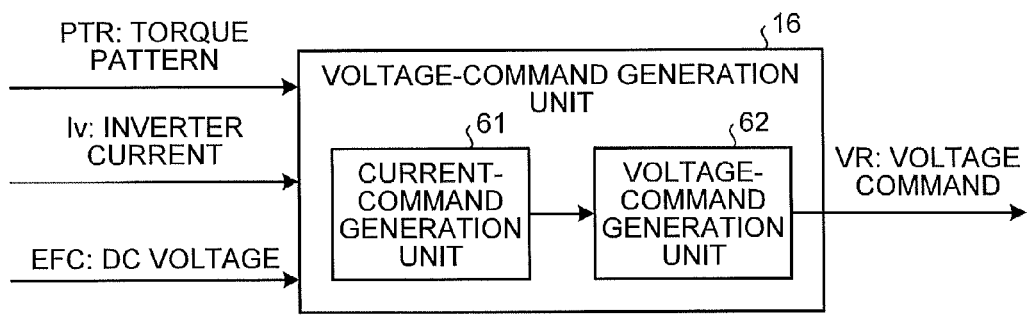
FIG. 6 depicts a detailed configuration of a voltage-command generation unit.

As shown in FIG. 6, the voltage-command generation unit 16 outputs a voltage command VR that is a commanded value of a voltage to be applied to the motor 11 based on the torque patterns PTR output from the torque-command generation unit 15, a DC voltage EFC measured by the voltage sensor 22, and an inverter current Iv measured by the current sensor 21 to the modulation-mode selection unit 17 and the gate-command generation unit 18 in a form of a voltage swing, a voltage frequency, a voltage phase angle, a modulation factor, and the like. While FIG. 6 depicts the configuration of the voltage-command generation unit 16 in which a current-command generation unit 61 and a voltage-command generation unit 62 are connected in series in this order as an example, the configuration of the voltage-command generation unit 16 is not limited to that shown in FIG. 6. Furthermore, because configurations of the current-command generation unit 61 and the voltage-command generation unit 62 are publicly well known, explanations thereof will be omitted.

As shown in FIG. 7, the modulation-mode selection unit 17 includes an element-temperature estimation unit 71 and a modulation-mode-signal generation unit 72. The element-temperature estimation unit 71 generates an element-temperature estimation value TE based on the voltage command VR output from the voltage-command generation unit 16, an element-mounting-surface temperature Tf from the temperature sensor 20, the inverter current Iv detected by the current sensor 21, and the velocity signal V detected by the velocity sensor 19. Note that all of the voltage command VR, the element-mounting-surface temperature Tf, the inverter current Iv, and the velocity signal V are not necessarily essential to a process of estimating the element-temperature estimation value TE. The element-temperature estimation value TE can be estimated, for example, by using only the element-mounting-surface temperature Tf or using the voltage command VR, the inverter current Iv, and the velocity signal V. The modulation-mode-signal generation unit 72 generates a modulation mode signal PM containing a carrier frequency, a pulse mode, and the like optimum for modulation based on the element-temperature estimation value TE estimated by the element-temperature estimation unit 71, and outputs the modulation mode signal PM to the gate-command generation unit 18. When a high-precision temperature sensor is used as the temperature sensor 20, it is possible to omit the element-temperature estimation unit 71. In this case, it suffices to input an output from the temperature sensor to the modulation-mode-signal generation unit 72 as the element-temperature estimation value TE.

As shown in FIG. 8, the gate-command generation unit 18 includes a modulation-wave generation unit 81, a carrier-wave generation unit 82, and a comparator 83. The voltage command VR generated by the voltage-command generation unit 16 and the modulation mode signal generated by the modulation-mode selection unit 17 are input to the gate-command generation unit 18. Based on the voltage command VR and the modulation mode signal PM, the modulation-wave generation unit 81 generates a modulation wave VREF and the carrier-wave generation unit 82 generates a carrier wave CAR for changing a cycle of the gate command. The modulation wave VREF and the carrier wave CAR are input to the comparator 83. The comparator 83 generates a result of comparing the modulation wave VREF with the carrier wave CAR as the gate command G, and outputs the gate command G to the inverter main circuit 12.

Next, a process of generating the modulation mode signal PM is explained with reference to a flowchart of FIG. 9. It is the modulation-mode-signal generation unit 72 of the modulation-mode selection unit 17 that performs the process shown in the flowchart. Furthermore, the element-temperature estimation value TE generated by the element-temperature estimation unit 71 is input to the modulation-mode-signal generation unit 72.

Figure 9:
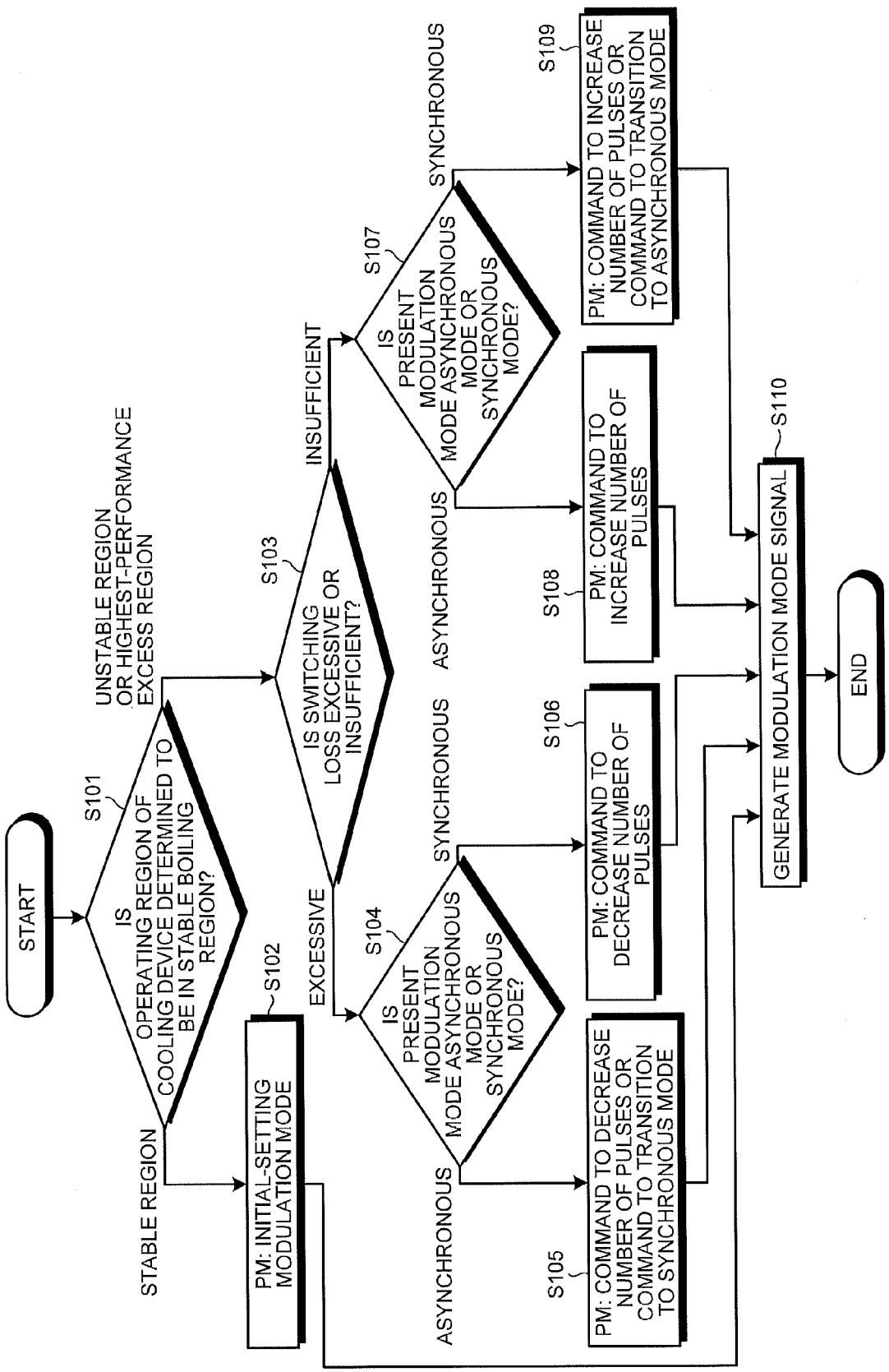
FIG. 9 is a flowchart for explaining a process of generating a modulation mode signal.

In FIG. 9, the modulation-mode-signal generation unit 72 determines whether an operating region of the cooling device is in a stable boiling region (FIG. 2: points D to E) based on the element-temperature estimation value TE (Step S101). When the operating region of the cooling device is in the stable boiling region, the modulation-mode-signal generation unit 72 selects an initial-setting modulation mode as a mode of the modulation mode signal PM (Step S102), generates the modulation mode signal in the initial-setting modulation mode (Step S110), and ends this flow.

When the operating region of the cooling device is not in the stable boiling region (FIG. 2: at the right of the point E or at the left of the point D), the modulation-mode-signal generation unit 72 determines whether the switching loss is excessive or insufficient (Step S103). When the switching loss is excessive (the operating region reaches the highest performance excess region), the modulation-mode-signal generation unit 72 further determines whether a present modulation mode is an asynchronous mode or a synchronous mode (Step S104). When the present modulation mode is the asynchronous mode, the modulation-mode-signal generation unit 72 selects a command to decrease the carrier frequency (the number of pulses: the number of pulses included in one cycle of the gate command) or a command to transition to the synchronous mode (Step S105). When the present modulation mode is the synchronous mode, the modulation-mode-signal generation unit 72 selects a command to decrease the carrier frequency (the number of pulses) (Step S106). In either case, the modulation-mode-signal generation unit 72 generates the modulation mode signal PM in response to the command (Step S110), and ends this flow.

On the other hand, when the modulation-mode-signal generation unit 72 determines that the switching loss is insufficient (the operating region of the cooling device 1 reaches the unstable boiling region) at Step S103, the modulation-mode-signal generation unit 72 further determines whether the present modulation mode is the asynchronous mode or the synchronous mode (Step S107). When the present modulation mode is the asynchronous mode, the modulation-mode-signal generation unit 72 selects a command to increase the carrier frequency (the number of pulses: the number of pulses included in one cycle of the gate command) (Step S108). When the present modulation mode is the synchronous mode, the modulation-mode-signal generation unit 72 selects a command to increase the carrier frequency (the number of pulses) or a command to transition to the asynchronous mode (Step S109). In either case, the modulation-mode-signal generation unit 72 generates the modulation mode signal PM in response to the command (Step S110), and ends this flow.

In the flowchart of FIG. 9, when the operating region of the cooling device is not in the stable boiling region, the modulation-mode-signal generation unit 72 determines first whether the switching loss is excessive or insufficient, and next whether the present modulation mode is the asynchronous mode or the synchronous mode. Alternatively, the order of these determinations can be reversed. That is, the modulation-mode-signal generation unit 72 can determine first whether the present modulation mode is the asynchronous mode or the synchronous mode and next whether the switching loss is excessive or insufficient.

Figure 10:
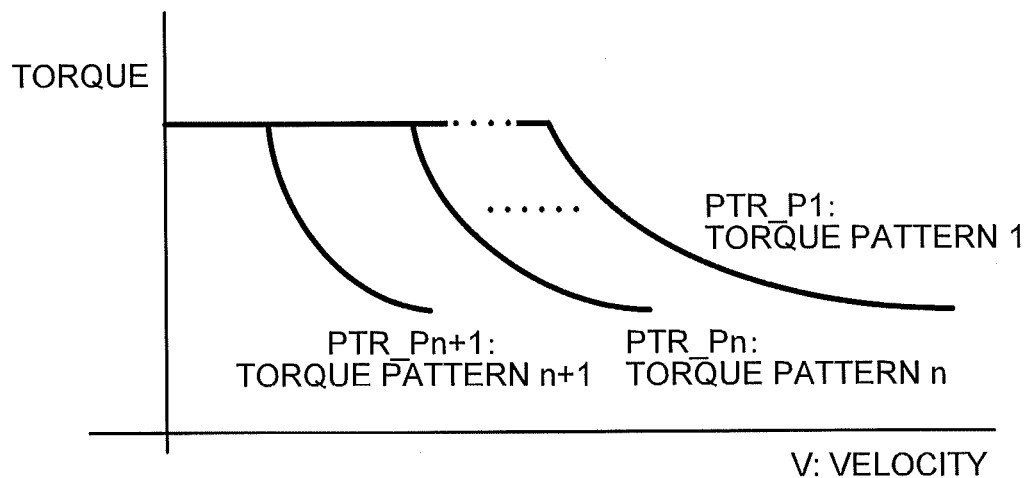
FIG. 10 is an enlarged view of powering-torque command patterns shown in FIG. 5 as a graph that embodies a powering-torque-command generation unit.

FIG. 10 is an enlarged view of powering-torque command patterns shown in FIG. 5 as a graph that embodies the powering-torque-command generation unit 55. In FIG. 10, a horizontal axis represents the velocity command V, a vertical axis represents the torque, and waveforms represent the torque patterns. FIG. 10 is an example in which these torque patterns PTR_P have drooping characteristics at a predetermined velocity, respectively, and in which velocities at which drooping starts (drooping start velocities) of these torque patterns PTR_P decrease in an order of 1→n→ ... →n+1.

Figure 11:
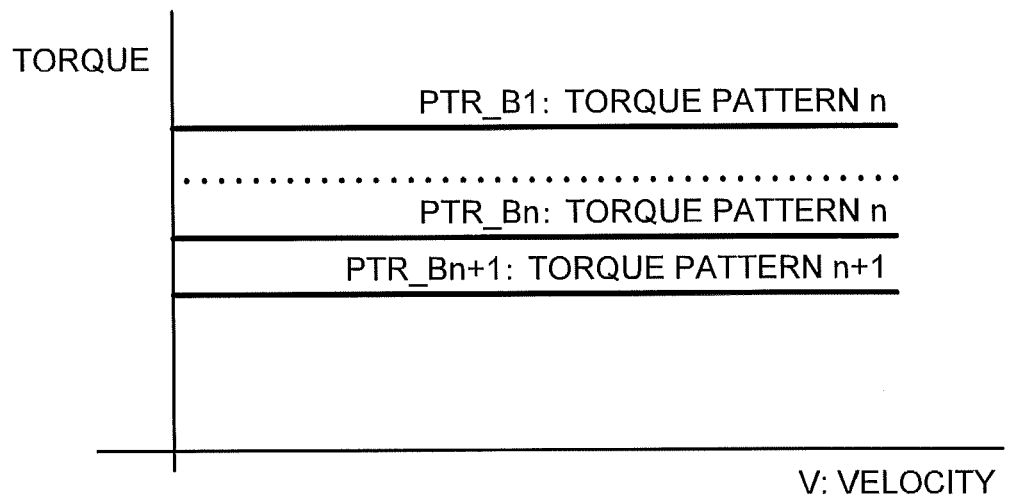
FIG. 11 is an enlarged view of braking-torque command patterns shown in FIG. 5 as a graph that embodies a braking-torque-command generation unit.

FIG. 11 is an enlarged view of braking-torque command patterns shown in FIG. 5 as a graph that embodies the braking-torque-command generation unit 56. In FIG. 11, a horizontal axis represents the velocity command V, a vertical axis represents the torque (a braking torque), and waveforms represent the torque patterns (braking torque patterns). Differently from FIG. 10, FIG. 11 is an example in which each of these torque patterns PTR_B has a characteristic of continuously outputting a constant torque irrespective of a magnitude of the velocity. Magnitudes of the torque patterns decrease in an order of 1→n→ ... →n+1.

In a case of a railway vehicle, a braking control device (not shown) normally adjusts a brake force when a damping force (a braking force) is applied to a vehicle body. That is, when a higher-level device inputs the braking command to the power conversion apparatus, it suffices that the power conversion apparatus generates a torque pattern in response to the input braking command and it is the braking control device that controls the braking force. Accordingly, it suffices to generate the torque patterns PTR_B(1 to n+1) as shown in FIG. 11.

Effects of the power conversion apparatus according to the first embodiment are explained next with reference to FIGS. 12 to 15.

Figure 12:
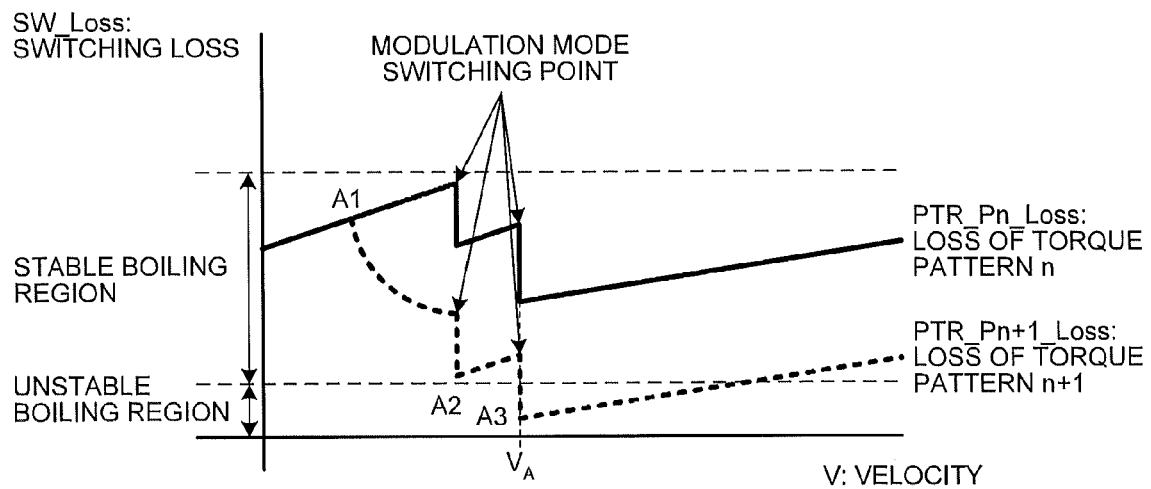
FIG. 12 is an example of a case where losses of a part of torque patterns enter an unstable boiling region when a modulation-mode switching control is executed.

FIG. 12 is an example of a case where losses of a part of torque patterns enter an unstable boiling region when a modulation-mode switching control is executed. In FIG. 12, a waveform indicated by a thick solid line refers to a loss curve corresponding to the torque pattern n among a plurality of torque patterns shown in FIG. 10, and a waveform indicated by a thick dashed line refers to a loss curve corresponding to the torque pattern n+1 among those shown in FIG. 10.

In FIG. 12, a loss PTR_Pn+1_Loss of the torque pattern n+1 decreases at a point A1 because the torque pattern PTR_Pn+1 droops and a current of the motor 11 falls.

The loss PTR_Pn+1_Loss of the torque pattern n+1 and a loss PTR_Pn_Loss of the torque pattern n decrease at a point A2 because the modulation mode transitions from the asynchronous mode to the synchronous mode and the carrier wave frequency (the number of pulses) decreases. However, the synchronous mode at the point A2 is a multiple-pulse mode in which the number of pulses included in a half cycle of a voltage between inverter output lines is equal to or larger than three. The asynchronous mode means a mode for setting the carrier wave frequency asynchronously with an output frequency, and the synchronous mode means a mode for setting the carrier wave frequency synchronously with the output frequency of an inverter.

The loss PTR_Pn+1_Loss of the torque pattern n+1 and the loss PTR_Pn_Loss of the torque pattern n decrease at a point A3 because the modulation mode transitions from the synchronous mode (the multiple-pulse mode) to the synchronous mode (a single-pulse mode) in which the number of pulses included in the half cycle of the voltage output from the inverter is one and the carrier wave frequency (the number of pulses) decreases.

According to the conventional technique, when the unstable boiling region is present in the cooling device, the loss PTR_Pn_Loss of the torque pattern PTR_n enters the unstable boiling region at the point A3 when the operation command A for the torque pattern PTR_n is input. However, as described above, the unstable boiling region depends not only on the switching loss but also on the ambient temperature of the cooling device. Therefore, it is needless to mention that the unstable boiling region is small when the ambient temperature is high, and is large when the ambient temperature is low.

The cause that the loss PTR_Pn_Loss of the torque pattern PTR_n enters the unstable boiling region at the point A3 when the operation command A for the torque pattern PTR_n is input is as follows. The power conversion apparatus has only one type of characteristics of the modulation mode held by the modulation-mode-signal generation unit with respect to the velocity, irrespectively of a magnitude of the torque pattern PTR.

Figure 13:
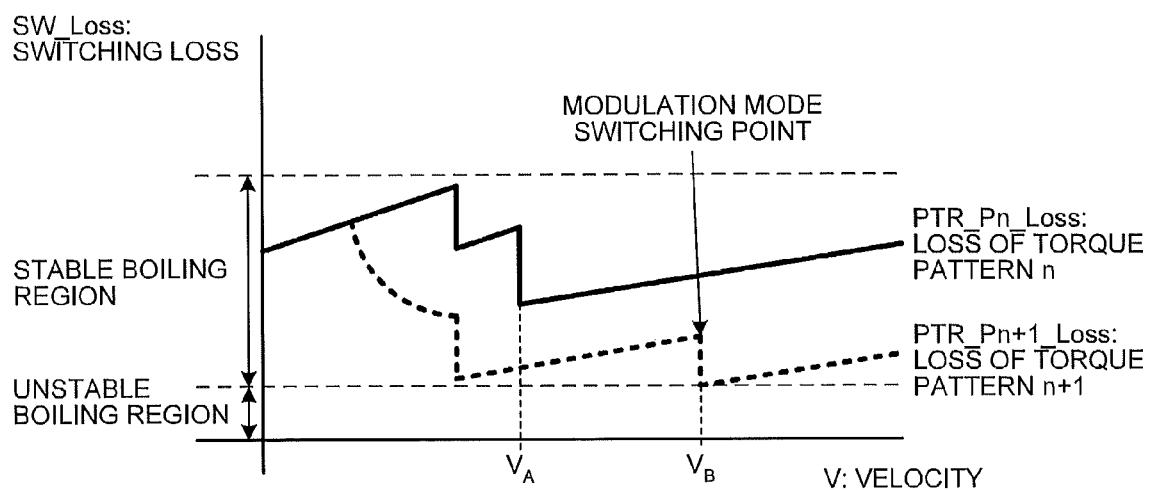
FIG. 13 is an example of a case of controlling losses of all torque patterns so as not to enter an unstable boiling region when a modulation-mode switching control is executed.

In contrast to FIG. 12, FIG. 13 is an example of a case of controlling losses of all torque patterns (two patterns are shown in FIG. 13) so as not to enter an unstable boiling region when a modulation-mode switching control is executed. The power conversion apparatus according to the present embodiment employs a control technique shown in FIG. 13.

According to the conventional technique of making a modulation mode switching velocity constant irrespectively of the torque patterns, the modulation mode is switched at the same velocity that is a velocity $V_A$ for all the different torque curves as shown in FIG. 12, for example. Accordingly, for example, the switching loss of the torque pattern n+1 enters the unstable boiling region when the loss is low.

On the other hand, according to the technique of the present application for switching the modulation mode switching velocities according to the torque patterns, the modulation mode is switched at the velocity $V_A$ for the torque pattern n and switched at a velocity $V_B$ for the torque pattern n+1 as shown in FIG. 13, for example. Therefore, it is possible to deter each switching loss from entering the unstable boiling region.

Figure 14:
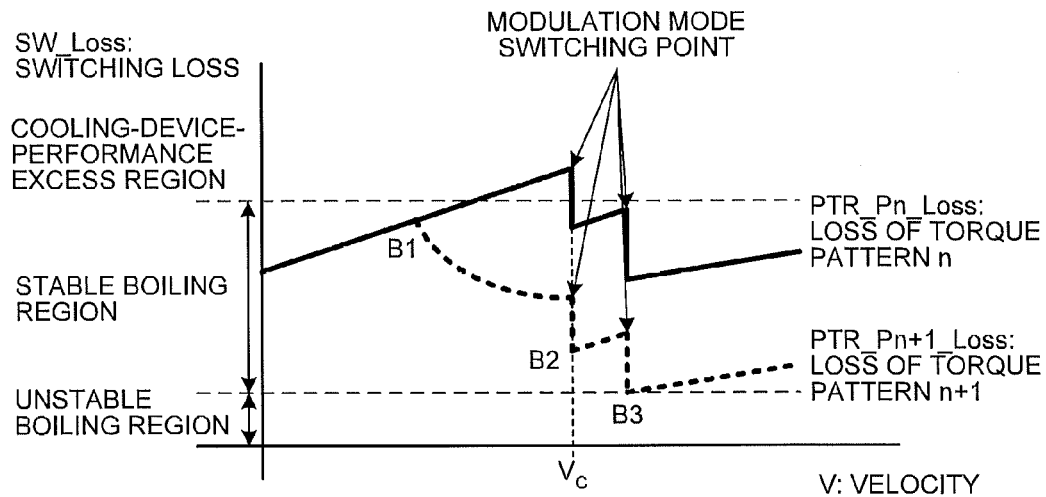
FIG. 14 is an example of a case where losses of a part of torque patterns enter a cooling-device-performance excess region when a modulation-mode switching control is executed.

FIG. 14 is an example of a case where losses of a part of torque patterns enter a cooling-device-performance excess region when a modulation-mode switching control is executed. In FIG. 14, a waveform indicated by a thick solid line refers to a loss curve corresponding to the torque pattern n among the torque patterns shown in FIG. 10, and a waveform indicated by a thick dashed line refers to a loss curve corresponding to the torque pattern n+1 among those shown in FIG. 10.

In FIG. 14, the loss PTR_Pn+1_Loss of the torque pattern n+1 decreases at a point B1 because the torque pattern PTR_Pn+1 droops and the current of the motor 11 falls.

The loss PTR_Pn+1_Loss of the torque pattern n+1 and the loss PTR_Pn_Loss of the torque pattern n decrease at a point B2 because the modulation mode transitions from the asynchronous mode to the synchronous mode and the carrier wave frequency (the number of pulses) decreases. However, the synchronous mode at the point B2 is assumed as the multiple-pulse mode in which the number of pulses included in the half cycle of the voltage between the inverter output lines is equal to or larger than three, for example.

The loss PTR_Pn+1_Loss of the torque pattern n+1 and the loss PTR_Pn_Loss of the torque pattern n decrease at a point B3 because the modulation mode transitions from the synchronous mode (the multiple-pulse mode) to the synchronous mode (the single-pulse mode) in which the number of pulses included in the half cycle of the voltage between the inverter output lines is one and the carrier wave frequency (the number of pulses) decreases.

The loss of the torque pattern PTR_n enters the unstable boiling region at the point B3 when the operation command A for the torque pattern PTR_n is input for the same reason as that of the case where the switching loss of the torque pattern enters the unstable boiling region when the loss is low. The power conversion apparatus has only one type of characteristic of the velocity with respect to the modulation mode held by the modulation mode generation unit, irrespectively of the torque pattern PTR_n.

Figure 15:
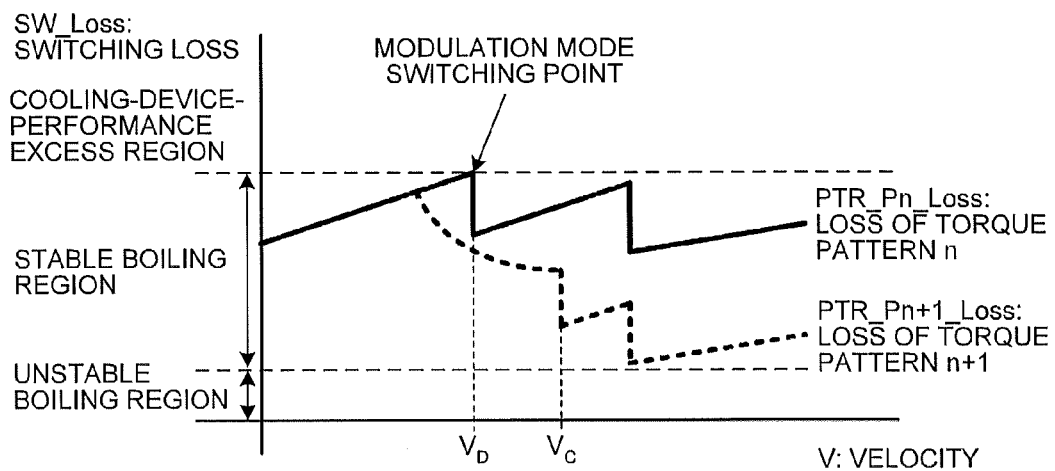
FIG. 15 is an example of a case of controlling losses of all torque patterns so as not to enter a cooling-device-performance excess region when a modulation-mode switching control is executed.

In contrast to FIG. 14, FIG. 15 is an example of a case of controlling losses of all torque patterns (two patterns are shown in FIG. 15) so as not to enter a cooling-device-performance excess region when a modulation-mode switching control is executed. The power conversion apparatus according to the present embodiment employs a control technique shown in FIG. 15.

According to the conventional technique of making the modulation mode switching velocity constant irrespectively of the torque patterns, the modulation mode is switched at the same velocity that is a velocity $V_C$ for all the different torque curves as shown in FIG. 14, for example. Accordingly, for example, the switching loss of the torque pattern n+1 enters the cooling-device-performance excess region when the loss is high.

On the other hand, according to the technique of the present application for switching the modulation mode switching velocities according to the torque patterns, the modulation mode is switched at a velocity $V_D$ for the torque pattern n and switched at the velocity $V_C$ for the torque pattern n+1 as shown in FIG. 15, for example. Therefore, it is possible to deter each switching loss from entering the cooling-device-performance excess region.

Second Embodiment

Figure 16:
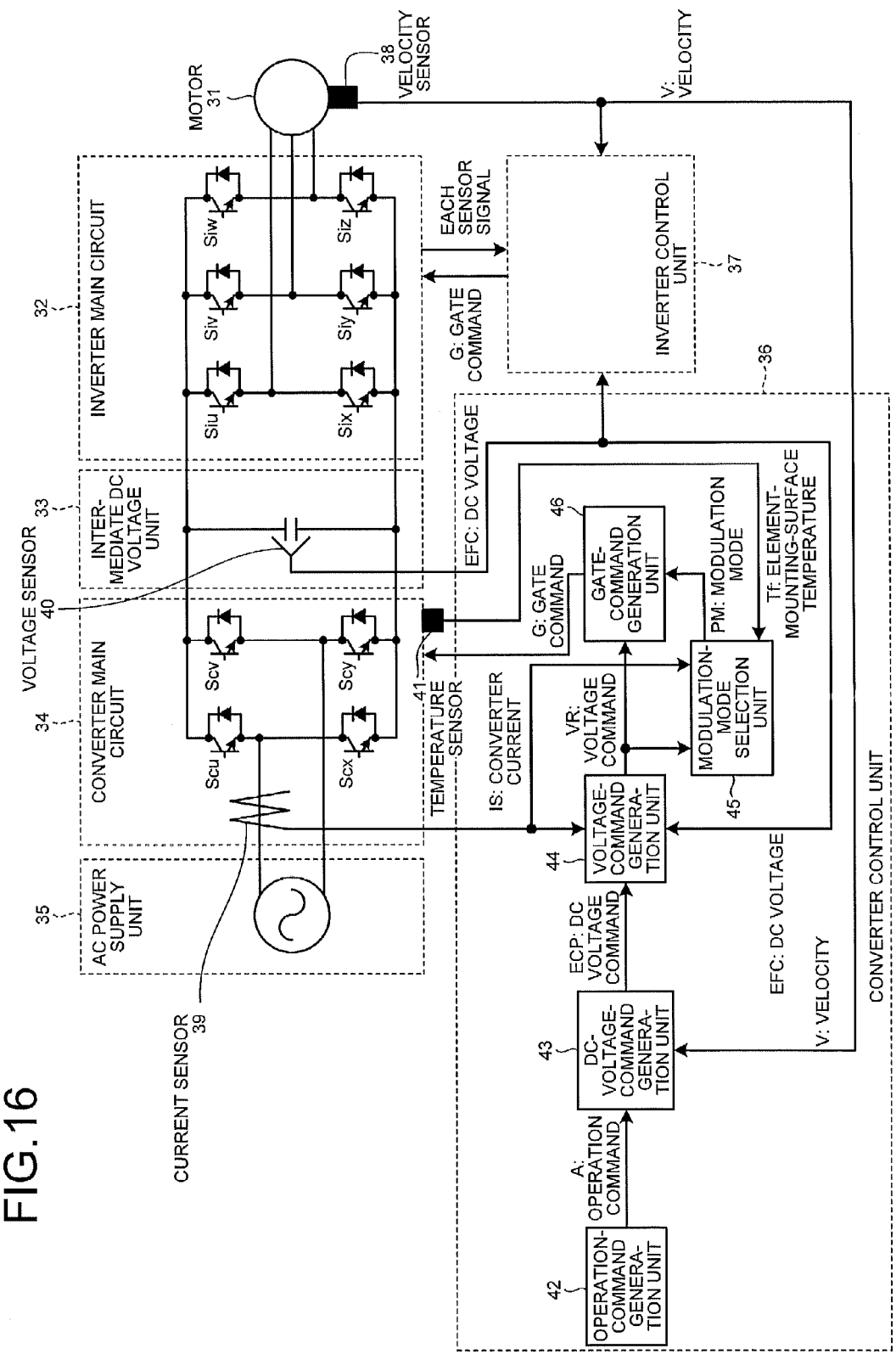
FIG. 16 is a block diagram of functions of a power conversion apparatus according to a second embodiment of the present invention.

A power conversion apparatus according to a second embodiment is explained next. FIG. 16 is a block diagram of functions of the power conversion apparatus according to the second embodiment of the present invention. The power conversion apparatus according to the second embodiment differs from that according to the first embodiment in that a power supply unit is a single-phase or three-phase AC power supply unit while the power supply unit is the DC power supply unit in the power conversion apparatus according to the first embodiment. Accordingly, as obvious from comparison of FIG. 3 with FIG. 16, the power conversion apparatus according to the second embodiment includes an AC power supply unit 35 and a converter main circuit 34 that converts an output (an AC voltage) from the AC power supply unit 35 into a DC voltage, and also includes an intermediate DC voltage unit 33 provided between the converter main circuit 34 and an inverter main circuit 32 and serving as a DC voltage supply unit.

In FIG. 16, a motor 31 operating at the three-phase AC (such as an induction motor or a synchronous motor) is connected to an output of the inverter main circuit 32. A velocity sensor 38 that measures the number of revolutions of the motor 31 is provided at the motor 31. A temperature sensor 41 that measures the temperature of the mounting surface on which the switching element is mounted either directly or indirectly is provided at the converter main circuit 34.

The converter main circuit 34 includes circuit units (legs) in which positive-side arms constituted by switching elements Scu and Scv and negative-side arms constituted by switching elements Scx and Scy are connected in series, respectively. That is, a single-phase bridge circuit including two sets of legs is constituted in the converter main circuit 34. Furthermore, a current sensor 39 that measures a converter current flowing into the converter main circuit 34 is provided among lines that connect AC terminals (median points of the respective legs) of the converter main circuit 34 to the motor 31.

The intermediate DC voltage unit 33 is a constituent element having a DC power accumulation capability, and a battery, a capacitor, and the like is assumed as the intermediate DC voltage unit 33. A voltage sensor 40 for detecting a DC voltage is provided in the intermediate DC voltage unit 33.

A converter control unit 36 is configured to include an operation-command generation unit 42, a DC-voltage-command generation unit 43, a voltage-command generation unit 44, a modulation-mode selection unit 45, and a gate-command generation unit 46. The gate-command generation unit 46 located at a last stage of the converter control unit 36 outputs the gate command G. The switching elements (Scu to Scy) of the converter main circuit 34 are controlled to be turned on or off in response to the gate command G. AC power supplied from the AC power supply unit 35 is converted into DC power by the converter main circuit 34, the DC power is further converted into three-phase AC power by the inverter main circuit 32, and the three-phase AC power is supplied to the motor 31.

An inverter control unit 37 is a control unit that controls the inverter main circuit 32. Not only the velocity signal V detected by the velocity sensor 38 and the DC voltage EFC detected by the voltage sensor 40 but also signals from various sensors are input to the inverter control unit 37. If the boiling-refrigerant-type cooling device is applied as a cooling device for the inverter main circuit 32, functions identical to those of the power conversion apparatus according to the first embodiment can be added to the inverter control unit 37. Because the functions in this case have already been explained in detail in the first embodiment, explanations thereof will be omitted here.

Figure 17:
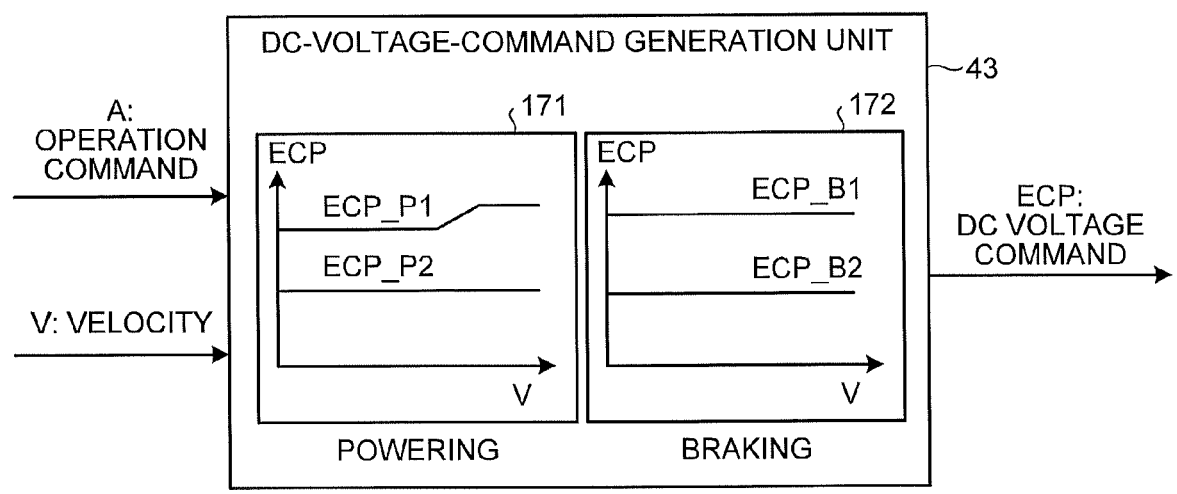
FIG. 17 depicts a detailed configuration of a DC-voltage-command generation unit.
Figure 18:
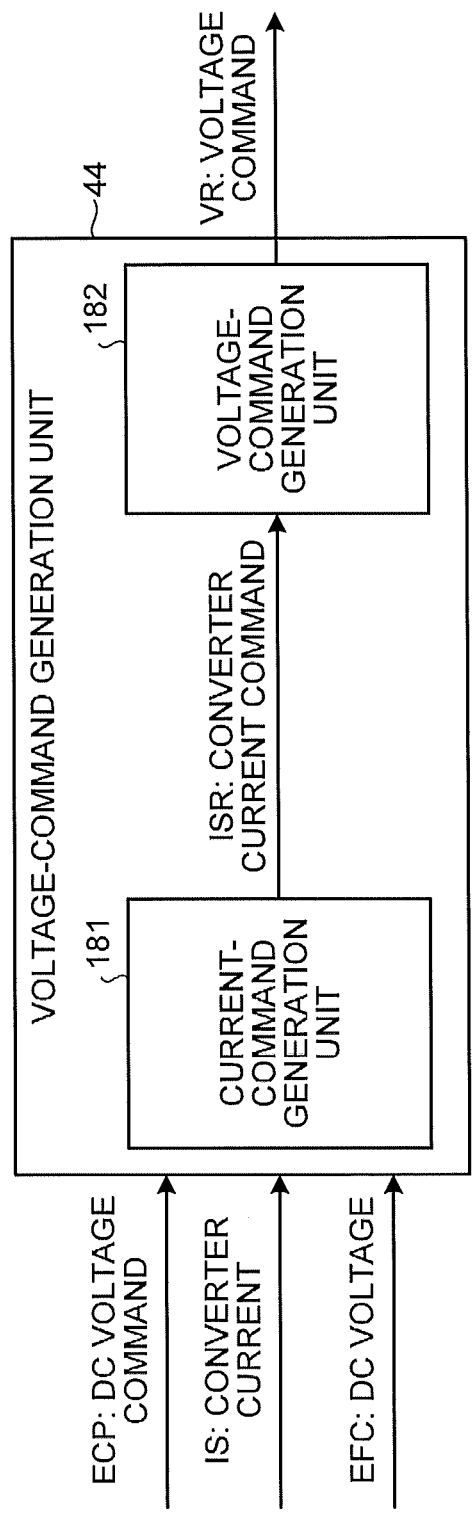
FIG. 18 depicts a detailed configuration of a voltage-command generation unit.
Figure 19:
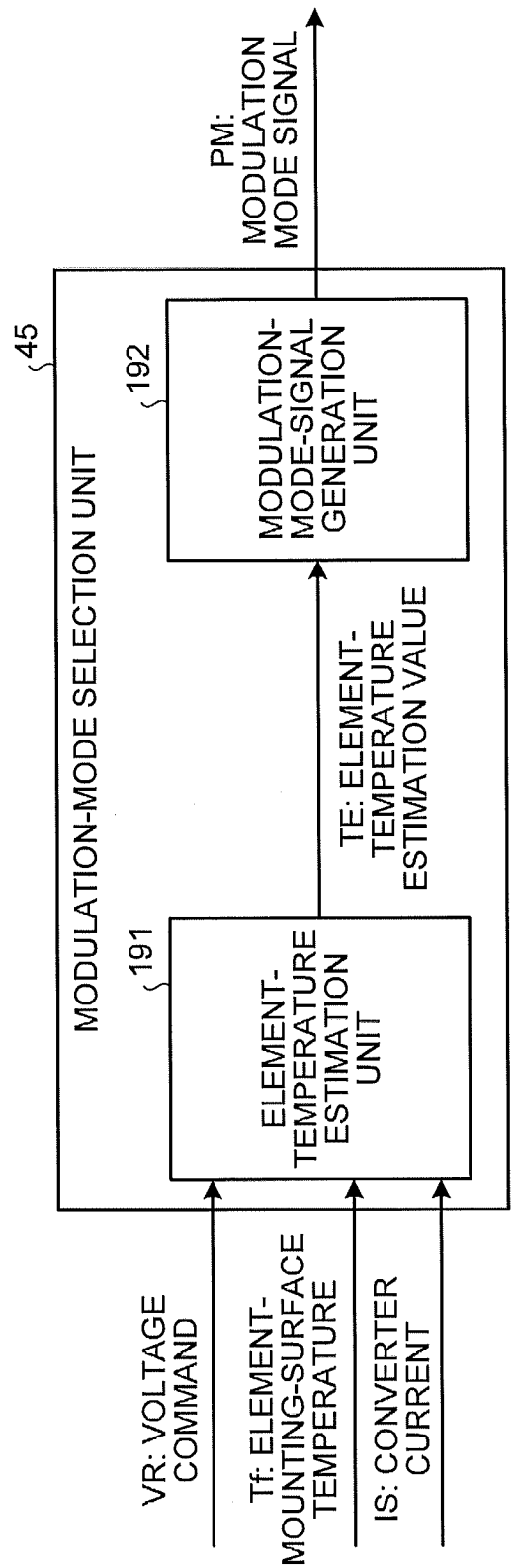
FIG. 19 depicts a detailed configuration of a modulation-mode selection unit.

Configurations and operations of the constituent elements that constitute the converter control unit 36 are explained next with reference to FIGS. 17 to 19. FIG. 17 depicts a detailed configuration of the DC-voltage-command generation unit 43, FIG. 18 depicts a detailed configuration of the voltage-command generation unit 44, and FIG. 19 depicts a detailed configuration of the modulation-mode selection unit 45. The functions and the configuration of the operation-command generation unit 42 are identical to those of the operation-command generation unit 14 according to the first embodiment shown in FIG. 4, and thus explanations thereof will be omitted here. Furthermore, the functions and the configuration of the gate-command generation unit 46 are identical to those of the gate-command generation unit 18 according to the first embodiment shown in FIG. 8, and thus explanations thereof will be omitted here. Similarly to the first embodiment, in a case where the operation-command output unit is provided on a cab as seen in a railway vehicle, for example, it is unnecessary to add the functions of the operation-command generation unit 42 of this type to the converter control unit 36.

As shown in FIG. 17, the DC-voltage-command generation unit 43 includes a powering-DC-voltage-command generation unit 171 and a braking-torque-command generation unit 172. The DC-voltage-command generation unit 43 calculates a required DC voltage command to be output by the motor 11 based on the operation command A and the velocity signal V from the velocity sensor 38, and outputs a necessary DC voltage command ECP to the voltage-command generation unit 44. While FIG. 17 depicts patterns of the DC voltage command ECP generated by the powering-DC-voltage-command generation unit 171 and the braking-torque-command generation unit 172 in a form of a graph, these patterns can be obtained by a functional calculus or held in a processing unit in a form of a table.

As shown in FIG. 18, the voltage-command generation unit 44 generates a converter current command ISR indicating a current flowing through the converter main circuit 34 based on the DC voltage command ECP output from the DC-voltage-command generation unit 43, the DC voltage EFC measured by the voltage sensor 40, and the converter current IS measured by the current sensor 39. In addition, the voltage-command generation unit 44 outputs the voltage command VR applied to the converter main circuit 34 based on this converter current command ISR to the modulation-mode selection unit 45 and the gate-command generation unit 46 in a form of the voltage swing, the voltage frequency, the modulation factor, and the like. While FIG. 18 depicts the configuration of the voltage-command generation unit 44 in which a current-command generation unit 181 and a voltage-command generation unit 182 are connected in series in this order as an example, the configuration of the voltage-command generation unit 44 is not limited to that shown in FIG. 18. Furthermore, because configurations of the current-command generation unit 181 and the voltage-command generation unit 182 are publicly well known, explanations thereof will be omitted.

As shown in FIG. 19, the modulation-mode selection unit 45 includes an element-temperature estimation unit 191 and a modulation-mode-signal generation unit 192. The element-temperature estimation unit 191 generates the element-temperature estimation value TE based on the voltage command VR output from the voltage-command generation unit 44, the element-mounting-surface temperature Tf from the temperature sensor 41, and the converter current IS detected by the current sensor 39. Note that all of the voltage command VR, the element-mounting-surface temperature Tf, and the converter current IS are not necessarily essential to the process of estimating the element-temperature estimation value TE. The element-temperature estimation value TE can be estimated, for example, by using only the element-mounting-surface temperature Tf or using the voltage command VR and the converter current IS. The modulation-mode-signal generation unit 192 generates the modulation mode signal PM containing the carrier frequency, the pulse mode, and the like optimum for the modulation based on the element-temperature estimation value TE estimated by the element-temperature estimation unit 191, and outputs the modulation mode signal PM to the gate-command generation unit 46.

A process of generating the modulation mode signal PM is explained next with reference to a flowchart of FIG. 20. It is the modulation-mode-signal generation unit 192 of the modulation-mode selection unit 45 that performs the process shown in the flowchart. Furthermore, the element-temperature estimation value TE generated by the element-temperature estimation unit 191 is input to the modulation-mode-signal generation unit 192.

Figure 20:
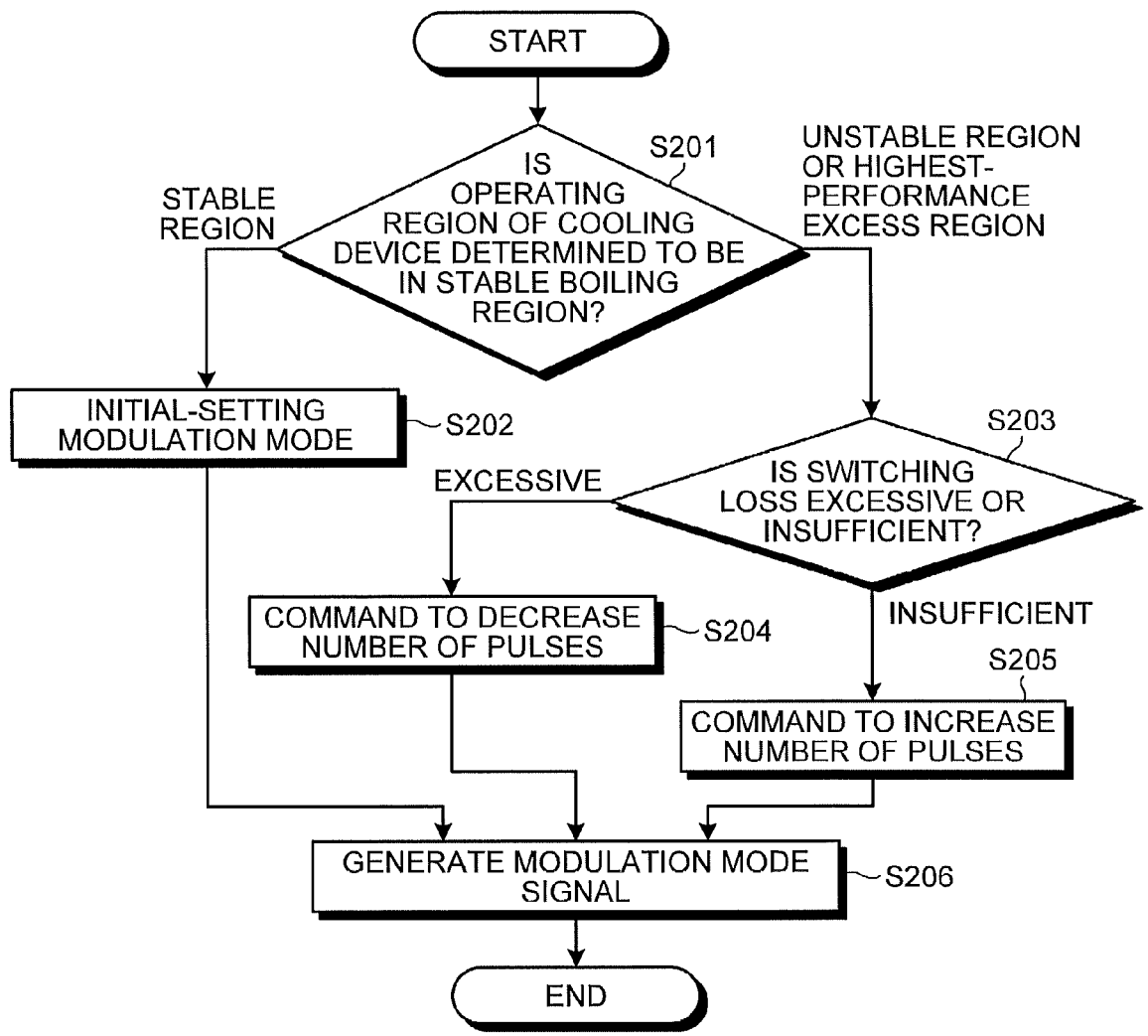
FIG. 20 is a flowchart for explaining a process of generating a modulation mode signal PM.

In FIG. 20, the modulation-mode-signal generation unit 192 determines whether the operating region of the cooling device is in the stable boiling region (FIG. 2: the points D to E) based on the element-temperature estimation value TE (Step S201). When the operating region of the cooling device is in the stable boiling region, the modulation-mode-signal generation unit 192 selects the initial-setting modulation mode as the mode of the modulation mode signal PM (Step S202), generates the modulation mode signal in the initial-setting modulation mode (Step S206), and ends this flow.

When the operating region of the cooling device is not in the stable boiling region (FIG. 2: at the right of the point E or at the left of the point D), the modulation-mode-signal generation unit 192 determines whether the switching loss is excessive or insufficient (Step S203). When the switching loss is excessive (the operating region reaches the highest performance excess region), the modulation-mode-signal generation unit 192 selects a command to decrease the carrier frequency (the number of pulses) (Step S204), generates the modulation mode signal PM in response to the command (Step S206), and ends this flow.

On the other hand, when the modulation-mode-signal generation unit 192 determines that the switching loss is insufficient (the operating region reaches the unstable boiling region) at Step S203, the modulation-mode-signal generation unit 192 selects a command to increase the carrier frequency (the number of pulses) (Step S205), generates the modulation mode signal PM in response to the command (Step S206), and ends this flow.

Effects of the power conversion apparatus according to the second embodiment are explained next with reference to FIGS. 21 and 22.

Figure 21:
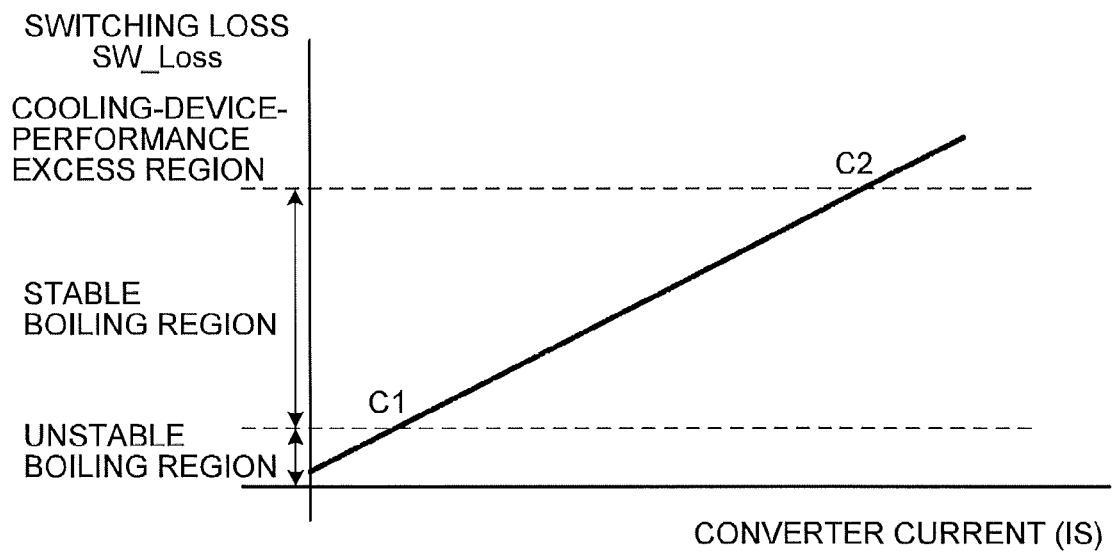
FIG. 21 depicts a relation between a converter current and a switching loss.

FIG. 21 depicts a relation between the converter current IS and a switching loss SW_Loss. When the cooling device applied to the converter main circuit is the boiling-refrigerant-type cooling device, the converter main circuit lies in the concept of the stable boiling region and the cooling-device-performance excess region similarly to the inverter main circuit.

The switching loss SW_Loss enters the unstable boiling region when the converter current IS is lower than a point C1, for example. Furthermore, in an example shown in FIG. 21, the switching loss SW_Loss enters the cooling-device-performance excess region when the converter current IS is higher than a point C2, for example. The cause that the switching loss SW_Loss enters the unstable boiling region at the point C1 and enters the cooling-device-performance excess region at the point C2 is as follows. The power conversion apparatus has only one type of characteristics of the modulation mode held by the modulation mode generation unit with respect to the converter current, irrespectively of a magnitude of the converter current IS.

Figure 22:
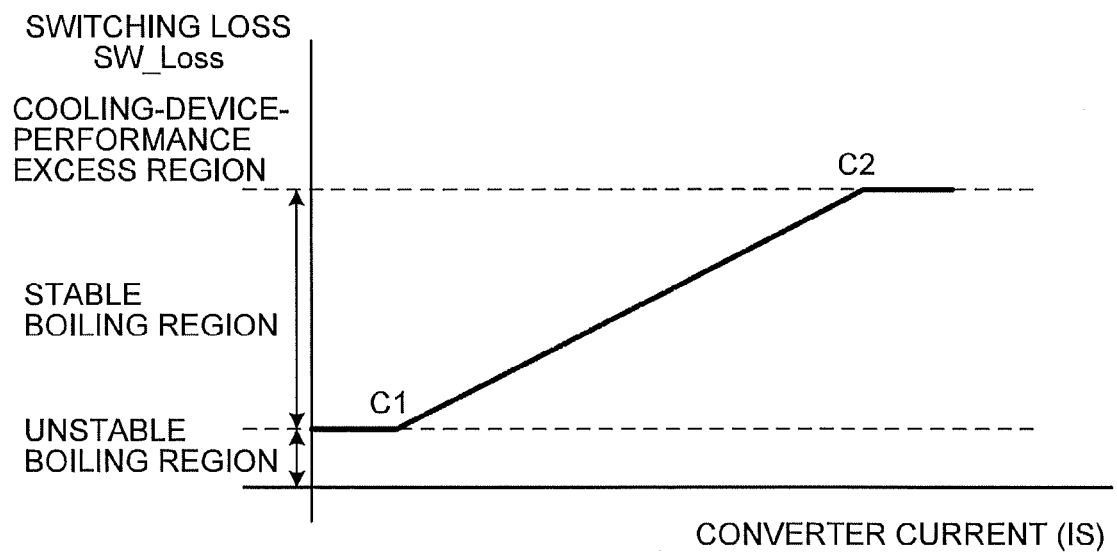
FIG. 22 is an example of a case of controlling a switching loss so as not to enter an unstable boiling region and a cooling-device-performance excess region.

In contrast to FIG. 21, FIG. 22 is an example of a case of controlling the switching loss SW_Loss so as not to enter an unstable boiling region and a cooling-device-performance excess region. The power conversion apparatus according to the present embodiment employs a control technique shown in FIG. 22.

As shown in FIG. 21, according to the conventional technique of switching the modulation modes linearly to the converter current, that is, the conventional technique of making constant the characteristics of the modulation mode switching with respect to the converter current, there is a probability that the switching loss SW_Loss enters the unstable boiling region when the converter current is low, and that the switching loss SW_Loss enters the cooling-device-performance excess region when the converter current is high.

On the other hand, by using the technique of the present application for controlling the carrier frequency (the number of pulses) to be increased when the converter current IS is low, and to be decreased when the converter current IS is high, that is, the technique of the present application for increasing or decreasing the carrier frequency (the number of pulses) in proportion to the converter current IS, it is possible to deter the switching loss from entering the unstable boiling region and to deter the switching loss from entering the cooling-device-performance excess region, as shown in FIG. 22.

In FIG. 22, characteristics of the unstable boiling region and the cooling-device-performance excess region vary, depending on the ambient temperature of the cooling device and the like. By making the carrier frequency (the number of pulses) variable, it is possible to change positions of operating points (the points C1 and C2) that define limit characteristics. Therefore, the power conversion apparatus according to the present invention can ensure deterring the cooling device from entering the unstable boiling region and the cooling-device-performance excess region in proportion to the arbitrary converter current IS.

In the above explanations, when the converter current IS is low, the switching loss is increased and the cooling device is deterred from entering the unstable boiling region by increasing the carrier frequency (the number of pulses). Alternatively, the switching loss can be increased and the cooling device can be deterred from entering the unstable boiling region by increasing a reactive current component of the converter current IS.

Third Embodiment

In a third embodiment, the switching elements included in the inverter main circuit and the converter main circuit are explained. Each of the switching elements used in the power conversion apparatus is normally configured so that a semiconductor transistor element (such as an IGBT or a MOSFET) made of silicon (Si) and a diode element made of the silicon similarly to the semiconductor transistor element are connected to each other back to back. The techniques described in the first and second embodiments can be employed for the inverter main circuit and the converter main circuit including these general switching elements.

However, the techniques of the first and second embodiments are not limited to the switching elements formed of the silicon. It is needless to mention that the techniques of the first and second embodiments can be used for an inverter main circuit and a converter main circuit each including switching elements made of silicon carbide (SiC) that has received attention in recent years in place of the silicon.

The silicon carbide has a characteristic of being available at a high temperature. Accordingly, the use of the switching elements made of the silicon carbide as those included in the inverter main circuit or the converter main circuit can reduce a switching loss of a semiconductor module on which the switching elements are mounted. However, the cooling device tends to be in an unstable boiling region because the switching loss is reduced when the switching elements made of the silicon carbide are used. Nevertheless, the present invention can increase the switching loss and deter the cooling device from entering the unstable boiling region even if the cooling device transitions to the unstable boiling region.

Silicon carbide (SiC) is an example of a semiconductor referred to as "wide bandgap semiconductor" deriving from the characteristic of the silicon carbide (SiC) that the silicon carbide (SiC) is wider than the silicon (S) in bandgap. For example, a semiconductor formed of a gallium nitride-based material or diamond other than the silicon carbide also belongs to the wide bandgap semiconductor, and characteristics of the gallium nitride-based material and the diamond have many similarities to those of the silicon carbide. Therefore, configurations using wide bandgap semiconductors other than the silicon carbide also fall within the scope of the present invention.

Transistor elements and diode elements formed of such a wide bandgap semiconductor are high in withstand voltage and high in allowable current density. Therefore, it is possible to downscale the transistor elements and the diode elements. By using these downscaled transistor elements and diode elements, it is possible to downscale a semiconductor module having these elements incorporated therein.

Because the transistor elements and the diode elements formed of a wide bandgap semiconductor are also high in heat resistance, radiator fins of a heat sink can be downscaled, thereby making it possible to further downscale the semiconductor module.

Furthermore, because the transistor elements and the diode elements formed of a wide bandgap semiconductor are low in power loss, efficiency of the switching elements and the diode elements can be improved and efficiency of the semiconductor module can be further improved accordingly.

While it is desirable that both of the transistor elements and the diode elements are formed of a wide bandgap semiconductor, it suffices that any one these elements are formed of a wide bandgap semiconductor, and the effects of the embodiments described above can be achieved even in this case.

INDUSTRIAL APPLICABILITY

As described above, the power conversion apparatus according to the present invention is useful as an invention that can ensure deterring an operating point of a boiling-refrigerant-type cooling device from entering an unstable boiling region.

REFERENCE SIGNS LIST 1 cooling device
2 condenser
3 evaporator
4 refrigerant
5 fin
6a, 6b refrigerant chamber
7 switching element
8 cooling air
9 hot air
11, 31 motor
12 inverter main circuit
13 DC power supply unit
14, 42 operation-command generation unit
15 torque-command generation unit
16, 44, 62, 182 voltage-command generation unit
17, 45 modulation-mode selection unit
18, 46 gate-command generation unit
19, 38 velocity sensor
20, 41 temperature sensor
21, 39 current sensor
22, 40 voltage sensor
23, 37 inverter control unit
23 intermediate DC voltage unit
32 inverter main circuit
33 intermediate DC voltage unit
34 converter main circuit
35 AC power supply unit
36 converter control unit
43 DC-voltage-command generation unit
51 powering/braking selection unit
52 torque-command selection unit
55 powering-torque-command generation unit
56 braking-torque-command generation unit
61, 181 current-command generation unit
71, 191 element-temperature estimation unit
72, 192 modulation-mode-signal generation unit
81 modulation-wave generation unit
82 carrier-wave generation unit
83 comparator
171 powering-DC-voltage-command generation unit

The invention claimed is:

1. A power conversion apparatus that is configured to convert input direct current power or alternating current power into desired alternating current power by a switching operation performed by a switching element, to output the desired alternating current power, and to cool the switching element by using a boiling-refrigerant-type cooling device that uses a boiling phenomenon of a refrigerant included therein, the power conversion apparatus comprising a control unit that controls the switching element by generating a gate command capable of stabilizing boiling of the refrigerant, wherein the control unit includes
a modulation-mode selection unit that determines stability of the cooling device based on an element-temperature estimation value that is an estimated temperature of the switching element, and that decides and selects a modulation mode for controlling the switching element based on a determination result, and
a gate-command generation unit that generates the gate command based on the modulation mode selected by the modulation-mode selection unit.

2. The power conversion apparatus according to claim 1, wherein the modulation-mode selection unit determines whether an operating region of the cooling device is in a stable boiling region or not, and commands the gate-command generation unit to generate a gate command capable of stabilizing the boiling of the refrigerant when the operating region is not in the stable boiling region.

3. The power conversion apparatus according to claim 2, wherein the cooling device is applied to an inverter main circuit that converts direct current power into alternating current power.

4. The power conversion apparatus according to claim 3, wherein a command signal output from the modulation-mode selection unit to the gate-command generation unit includes at least one of a command to change a modulation mode, a command to change a frequency of a carrier wave that is used for generating a gate command, and a command to change number of pulses included in one cycle of a gate command.

5. The power conversion apparatus according to claim 4, wherein
the modulation-mode selection unit includes an element-temperature estimation unit that estimates a temperature of the switching element based on a temperature detection signal from a temperature sensor that detects a temperature of a mounting surface on which the switching element is mounted, and
the modulation-mode selection unit generates the command signal by using a temperature estimated by the element-temperature estimation unit.

6. The power conversion apparatus according to claim 4, wherein
the modulation-mode selection unit includes an element-temperature estimation unit that estimates a temperature of the switching element based on a current flowing into the inverter main circuit, a velocity of a motor connected to the inverter main circuit, and a voltage command that is a commanded value of a voltage applied to the motor, and
the modulation-mode selection unit generates the command signal by using a temperature estimated by the element-temperature estimation unit.

7. The power conversion apparatus according to claim 2, wherein the cooling device is applied to a converter main circuit that converts alternating current power into direct current power.

8. The power conversion apparatus according to claim 7, wherein a command signal output from the modulation-mode selection unit to the gate-command generation unit includes at least one of a command to change a frequency of a carrier wave that is used for generating a gate command, a command to change number of pulses included in one cycle of a gate command, and a command to change a current flowing through the converter main circuit.

9. The power conversion apparatus according to claim 8, wherein
the modulation-mode selection unit includes an element-temperature estimation unit that estimates a temperature of the switching element based on a temperature detection signal from a temperature sensor that detects a temperature of a mounting surface on which the switching element is mounted, and the modulation-mode selection unit generates the command signal by using a temperature estimated by the element-temperature estimation unit.

10. The power conversion apparatus according to claim 8, wherein the modulation-mode selection unit includes an element-temperature estimation unit that estimates a temperature of the switching element based on a current flowing into the converter main circuit and a voltage command that is a commanded value of a voltage applied to the converter main circuit, and the modulation-mode selection unit generates the command signal by using a temperature estimated by the element-temperature estimation unit.

11. The power conversion apparatus according to claim 8, wherein the modulation-mode selection unit increases a switching loss of the switching element by executing a control to increase a reactive current component of a current flowing through the converter main circuit.

12. The power conversion apparatus according to claim 2, wherein the stable boiling region is an operating region in which the boiling of the refrigerant is stable.

13. The power conversion apparatus according to claim 2, wherein the stable boiling region is an operating region in which the boiling of the refrigerant is stable, and in which the switching element does not exceeds a usage limit thereof.

14. The power conversion apparatus according to claim 1, wherein at least one of a transistor element and a diode element that constitutes the switching element is formed of a wide bandgap semiconductor.

15. The power conversion apparatus according to claim 14, wherein the wide bandgap semiconductor is a semiconductor using silicon carbide, a gallium nitride-based material, or diamond.

* * * * *